United States Patent [19]
Nyswander

[11] Patent Number: 5,585,997
[45] Date of Patent: Dec. 17, 1996

[54] HYDROGEN THYRATRON MODULATOR

[76] Inventor: Reuben E. Nyswander, 504 B Essex, China Lake, Calif. 93555

[21] Appl. No.: 86,505

[22] Filed: Oct. 22, 1979

[51] Int. Cl.⁶ .............................. H03K 3/30; H03K 1/18; H03B 9/10
[52] U.S. Cl. .......................... 361/201; 361/205; 219/114; 102/219
[58] Field of Search ........................ 332/5, 112; 307/265, 307/314, 246, 252 R; 328/58, 65, 67; 192/219; 219/114; 361/201, 205

[56] References Cited

U.S. PATENT DOCUMENTS

| | | | |
|---|---|---|---|
| 2,409,038 | 10/1946 | Hansell . | |
| 2,946,958 | 7/1960 | Bonia et al. | 328/65 |
| 3,207,994 | 9/1965 | Theodore et al. | 328/67 |
| 3,432,679 | 3/1969 | O'Brien . | |
| 3,525,940 | 8/1970 | Quesinberry . | |
| 3,611,211 | 10/1971 | Theordore | 332/12 |
| 3,928,809 | 12/1975 | Tschudi et al. | 367/265 |
| 4,051,439 | 9/1977 | Nyswander | 328/67 |
| 4,109,216 | 8/1978 | Nyswander | 331/87 |
| 4,119,917 | 10/1978 | Nyswander et al. | 328/67 |
| 4,150,307 | 4/1979 | Loucks | 328/65 |

*Primary Examiner*—Nelson Moskowitz

[57] ABSTRACT

A single resonant DC charging circuit provides both the power and timing for the pedestal insertion is, likewise, controlled by a single trigger circuit input and by a saturable reactor which controls the firing of a thyratron switch.

6 Claims, 3 Drawing Sheets

THYRATRON GRID TO CATHODE WAVEFORM

THYRATRON ANODE TO GROUND WAVEFORM

HYDROGEN THYRATRON MODULATOR

BACKGROUND OF THE INVENTION

1. Field of the Invention

This invention pertains to the field of electronic and radiation physics. More particularly, the invention pertains to microwave generation. By way of further characterization, the invention pertains to pulse modulated magnetrons. In still greater particularity, the invention pertains to a pedestal-pulse modulator for a magnetron diode. Specifically, the invention will be described as it pertains to an expendable radar modulator for a missile guidance system but need not be limited to this exemplary configuration and use.

2. Description of the Prior Art

The use of expendable microwave radars for target detection devices in guided missiles is a well established procedure. As the field of electronics hardware has progressed it is possible to make a radar transmitter of extremely small size and weight such that sophisticated radar target detecting systems may be housed in the instrument package of expendable missiles. However, the short pulse requirements of such systems requires state of the art type solid state devices which must be hand selected and are relatively expensive compared to the electron switching capabilities of vacuum and gas filled tubes.

Additionally, other demands placed upon the production of solid state devices limit their availability for use in low-cost, expendable systems. With the advent of advances in heater design permitting relatively short warm up times, it is feasible to use gas filled thyratron tubes as switching elements. In the past, however, the use of such tubes required more extensive synchronization and driving circuitry than the more modern solid state circuit equivalents.

SUMMARY OF THE INVENTION

The invention utilizes a single thyratron switch in conjunction with solid state and magnetic devices to achieve a pedestal pulse type modulation to permit the very short pulse widths necessary for a short range, high resolution radar system. In the circuit of the invention a single, slowly-rising, high-voltage pulse brings the magnetron into the Hartree region prior to the application of a short duration trigger pulse. This short-duration, trigger pulse is derived from the energy used to create the Hartree pedestal and by the use of a step-up transformer. The same pulse which creates the pedestal provides both the energy and the timing requirements to effect a short-duration, high-energy, drive pulse. With these considerations in mind it is an object of the invention to provide an improved pulse modulator for a magnetron diode.

A further object of the invention is to provide a pedestal pulse modulator using a single thyratron switch.

A further object of the invention is to provide a pulse modulator having a short pulse width for use with a target detecting radar.

These and other objects of the invention will become more readily desireable to persons skilled in the electronics arts to which they pertain after considering the following description of the preferred embodiments, various figures, and appended claims.

DESCRIPTION OF THE PREFERRED EMBODIMENT

Figure 1:
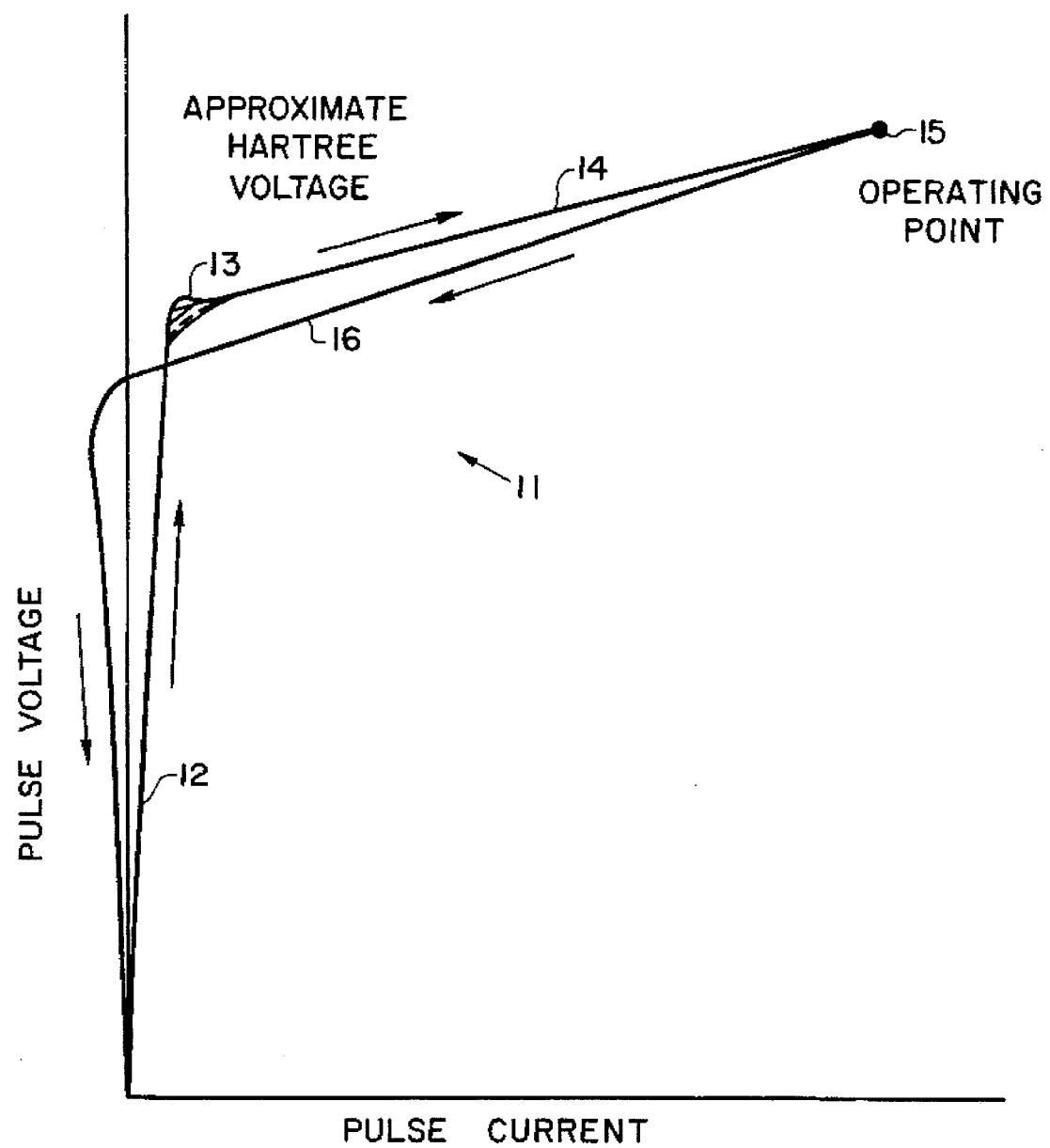
FIG. 1 is a graphic representation of typical dynamic characteristics of a magnetron.

Referring to FIG. 1, a typical pulse magnetron has a dynamic voltage-current characteristic represented by curve 11. As illustrated, the current of the magnetron increases only slowly during an initial application of a voltage pulse indicated at region 12. This is because the magnetron presents a high dynamic impedance until the characteristic voltage, known as the Hartree voltage, is obtained. This Hartree region, illustrated at 13, is the region at which cavity oscillation commences. At the Hartree voltage, there is a considerable noise energy in the magnetron caused by the motions of the electrons in this space charge surrounding the cathode. Noise in the proper frequency region supplies the energy from which the oscillations in the resonant cavities start. This process is statistical in nature, and the time required for oscillations to start has some statistical distribution.

Thus, the rising edge of the voltage pulse must permit a finite dwell time in the Hartree region to assure that the oscillations start properly for each pulse. If the voltage rises too rapidly through the Hartree region, the tube may oscillate in the wrong mode, the wrong frequency, or fail to oscillate at all. Thus, too rapid passage through the Hartree region results in pulse irregularities where many pulses may be missing, not have the appropriate frequency, or be at a reduced power level.

As the voltage increases further, as represented by portion 14 of curve 11, the current in the magnetron increases rapidly until the optimum operating point, illustrated at 15, is obtained. On the removal of the voltage pulse, the magnetron current falls rapidly as illustrated by portion 16 of curve 11. The slight negative overshoot of portion 16 in returning to the zero current condition is caused by circuit characteristics well understood in the electronic arts.

It has been discovered that microwave magnetron generators may be used with extremely short pulses if the magnetron is held in the Hartree voltage region prior to the application of the short pulse. Such short pulse modulation techniques, known as pedestal modulators, are today well understood in the electronics arts.

Figure 2:
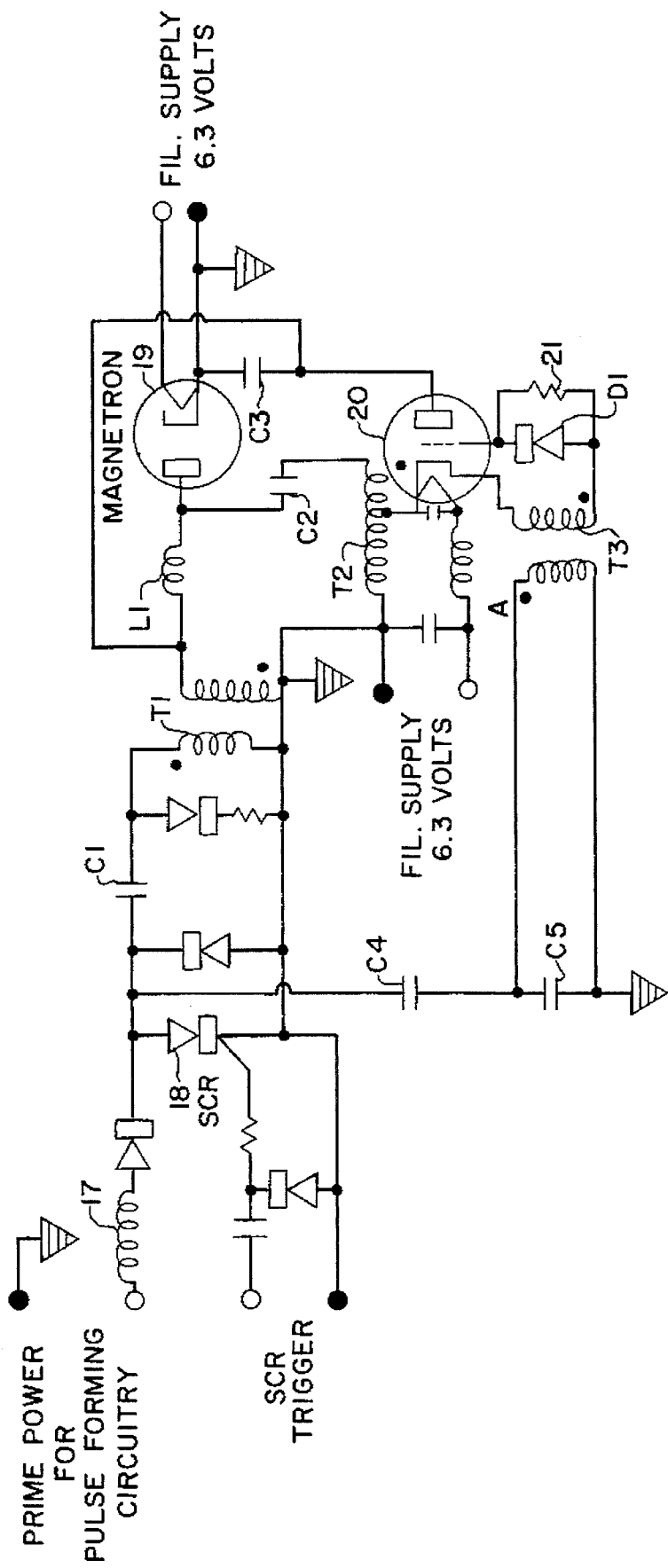
FIG. 2 is a schematic representation of a preferred embodiment of the invention.

Referring to FIG. 2, an arrangement for obtaining this desired operation is illustrated. A DC resonance charging inductor 17 which may be an external portion of the prime power pulse forming circuitry together with a capacitor C1 forms a DC resonant charging circuit to charge capacitor C1 to a desired input voltage. A silicon controlled rectifier, SCR, 18 is triggered by an SCR trigger pulse coming from the pulse recurrence frequency (PRF) determining circuitry to cause capacitor C1 to discharge through the primary of a transformer T1. Transformer T1 is wound such that there is a considerable primary and secondary leakage inductance. This comprises a pulse forming inductance for the pedestal voltage pulse. The energy in capacitor C1 charges capacitors C2, and C3, via the inductive circuit of transformer T1. The peak charging voltage on capacitor C2 and C3 is approximately the Hartree voltage level for the chosen magnetron. In the illustrated circuit arrangement the peak value of this pedestal is reached in about 0.9 microseconds after the SCR has been gated on. The voltage on capacitor C2 is connected to the anode of the magnetron to provide the pedestal pulse to hold the magnetron in the Hartree region. Because of the presence of an inductor L1, to be described later, it will be observed that the voltage on capacitor C2 takes slightly longer to reach its peak value than that on C3. However, the effect is small and of no consequence in the operation of the circuit.

When the pedestal pulse at the anode of magnetron 19 has reached its peak level, the thyratron 20 is triggered on. The short pulse storage capacitor C3 then discharges through thyratron 20 and the primary of an auto pulse transformer T2, the primary tap of which is connected to the cathode of thyratron 20. T2, as shown, has a bifilar winding to prevent excessive voltage from appearing across the cathode to filament circuit of thyratron 20 as is conventional in the high voltage application arts, however, the transformer functions as a pulse auto transformer. The output of T2 is a stepped-up, short pulse which is coupled to the anode of magnetron 19, via capacitor C2, to add to the Hartree voltage theron and produce the desired short burst of oscillation.

The short pulse at the magnetron anode is isolated from the long pulse pedestal circuitry by the inductance L1, previously described which presents a large reactance to the short pulse but negligible reactance to the slower rising pedestal waveform.

Figure 3:
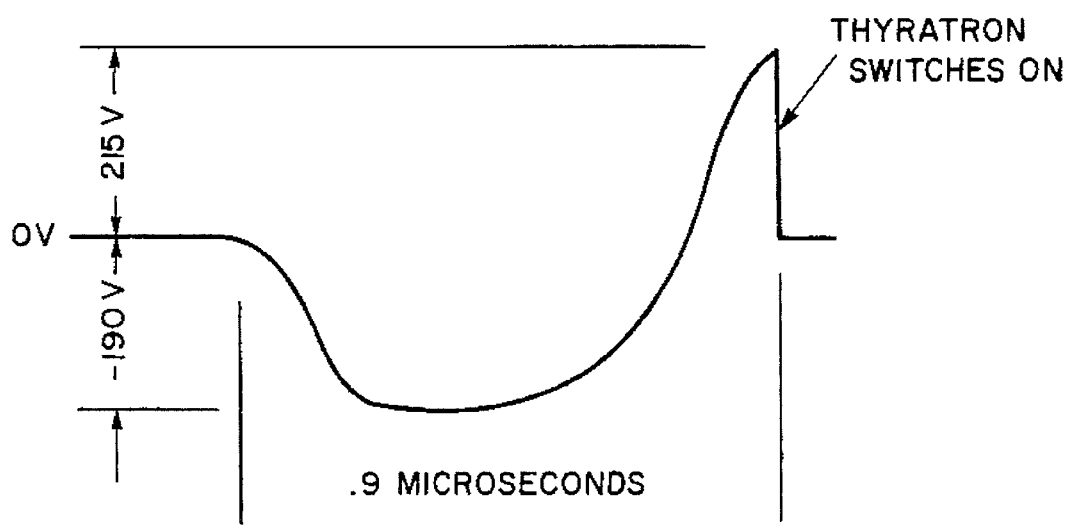
FIG. 3 is a grid to cathode waveform on the thyratron switch used in the invention.

The triggering of thyratron 20 is accomplished by a trigger circuit to be presently described. When SCR 18 is in the non-conducting mode, capacitor C4 is charged at the same time that capacitor C1 is charged. When SCR 18 is gated on, C4 discharges through the primary of a transformer T3 and point A is driven negative. By the transformer action of T3, the grid of thyratron 20 is also driven negative with respect to the cathode, via resistor 21. After approximately 0.7 microseconds, the negative pulse is followed by a positive backswing. The negative pulse is terminated and is followed by a positive backswing as illustrated in the FIG. 3 waveform.

The grid of thyratron 20 is driven positive with respect to the cathode via diode D1 connected in parallel with resistor 21 causing thyratron 20 to switch on with the resulting discharge of capacitor C3, previously The timing of the actuation of thyratron 20 is controlled by the design of transformer T3 and the values of capacitors C4 and C5. These values are adjusted to give the desired 0.9 microsecond delay permitting the pedestal pulse to be developed and magnetron 19 to be held in the Hartree region for a sufficient length of time to permit the short pulse to provide the desired resonant oscillations.

Figure 4:
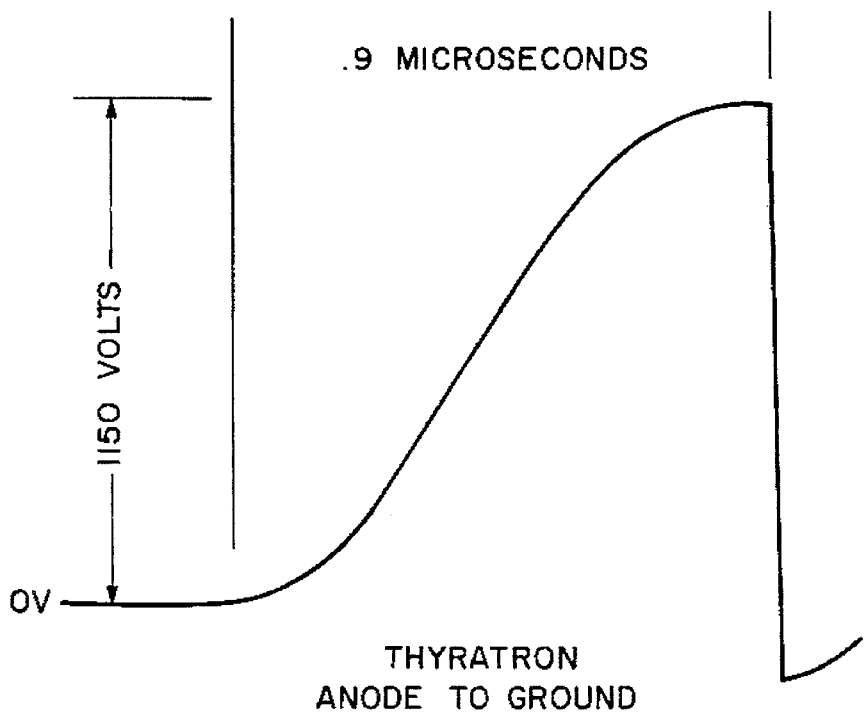
FIG. 4 is the thyratron anode to ground waveform in the illustrated preferred arrangement of the invention.

The positive transient on the anode of thyratron 20 is shown in FIG. 4. and represents the short pulse charging waveform from storage capacitor C3. The anode voltage rate of rise is much faster than is customary for hydrogen thyratrons. This positive anode transient is coupled to the grid via the anode to grid capacity. And this grid transient would be large enough to trigger the thyratron prematurely were it not for the negative pulse present on the grid at that time due to the action of transformer T3, previously discussed.

The recovery of thyratron 20 is assured by the anode voltage thereof remaining at 0 volts for nearly the entire pulse recurrence frequency period unto the next cyclic charging of capacitor C3.

Thus, it may be seen that the foregoing description taken together with the appended claims constitutes a disclosure to enable one versed in the electronics and microwave generation arts having benefit of the teachings contained therein to make and use the invention. Further, this invention provides a meritorius advance in the art not obvious to such a person not having the benefit of these teachings.

What is claimed is:

1. A pulse modulation system comprising:

a source of D.C. potential having a ground return;

a first capacitor effectively connected to said source of DC potential for electrical storage;

switch means connected to said first capacitor for selectively discharging said first capacitor;

a first transformer connected to said first capacitor and to said switch means for transfer of electrical energy from the discharge current of said first capacitor;

a second capacitor effectively connected to said transformer to receive and store the electrical energy transferred from said first capacitor;

a magnetron diode having an anode connected to said second capacitor and a cathode connected to the ground return of said source of DC potential;

a third capacitor connected to said transformer for storing energy transferred from said first capacitor;

a thyratron having an anode connected to said third capacitor and a cathode, and a control grid;

an auto transformer connected to the cathode of said thyratron such that current flowing therethrough passes through the primary winding thereof and having a secondary winding connected to said second capacitor; and circuit means connected to said control grid of said thyratron and to said switch means for timely actuation of said thyratron, whereby said third capacitor is caused to discharge through said auto transformer such that a stepped-up pulse is applied to the anode of said magnetron via said auto transformer and said second capacitor.

2. A pulse modulator according to claim 1 wherein said first switch means includes a silicon controlled rectifier.

3. A pulse modulator according to claim 1 wherein said second capacitor is connected to said transformer via an inductor.

4. A pulse modulator according to claim 1 in which said circuit means includes:

a fourth capacitor connected to said first capacitor so as to be charged therewith;

a second transformer connected to said fourth capacitor and to said first switch for transfer the electrical energy from the discharge of said fourth capacitor bay said switch, said second transformer being constructed to saturate prior to complete discharge, said second transformer having a secondary winding effectively connected to said control grid of said thyratron for holding said thyratron in a cut-off condition prior to saturation and to trigger said thyratron after saturation.

5. A pulse modulator according to claim 4 wherein said second transformer secondary is connected to said control grid by a resistor.

6. A pulse modulator according to claim 5 wherein said resistor is paralleled by a diode so as to provide a low resistance shunt for said trigger.

\* \* \* \* \*